United States Patent
Schulze et al.

(10) Patent No.: US 11,026,357 B2
(45) Date of Patent: Jun. 1, 2021

(54) CONTAINING ELECTRO-MAGNETIC INTERFERENCE (EMI) USING A NUMBER OF LOW-PROFILE SPRING DEVICES

(71) Applicant: HEWLETT PACKARD ENTERPRISE DEVELOPMENT LP, Houston, TX (US)

(72) Inventors: James Jeffery Schulze, Houston, TX (US); Earl W. Moore, Houston, TX (US); Keith A. Sauer, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 355 days.

(21) Appl. No.: 15/774,363

(22) PCT Filed: Jan. 11, 2016

(86) PCT No.: PCT/US2016/012859
§ 371 (c)(1),
(2) Date: May 8, 2018

(87) PCT Pub. No.: WO2017/123194
PCT Pub. Date: Jul. 20, 2017

(65) Prior Publication Data
US 2020/0253097 A1   Aug. 6, 2020

(51) Int. Cl.
*H05K 9/00* (2006.01)
*H05K 7/14* (2006.01)
(52) U.S. Cl.
CPC ......... *H05K 9/0049* (2013.01); *H05K 7/1488* (2013.01)

(58) Field of Classification Search
CPC .................................................... H05K 9/0062
See application file for complete search history.

(56) References Cited

U.S. PATENT DOCUMENTS

| | | | |
|---|---|---|---|
| 5,539,149 A | 7/1996 | Gatti | |
| 5,917,147 A | 6/1999 | Lewis | |
| 6,137,052 A * | 10/2000 | Kurrer | H05K 9/0016 174/351 |
| 6,194,653 B1 | 2/2001 | McMiller et al. | |
| 6,219,239 B1 | 4/2001 | Mellberg et al. | |
| 6,320,120 B1 | 11/2001 | Van | |
| 6,483,024 B1 * | 11/2002 | Smithson | H05K 9/0016 174/354 |
| 6,618,271 B1 | 9/2003 | Erickson et al. | |

(Continued)

OTHER PUBLICATIONS

International Search Report and Written Opinion, International Application No. PCT/US2016/012859, dated Oct. 10, 2016, pp. 1-11, KIPO.

*Primary Examiner* — Hung V Ngo
(74) *Attorney, Agent, or Firm* — Fabian VanCott

(57) ABSTRACT

In one example in accordance with the present disclosure an electro-magnetic interference (EMI) containment device is described. The EMI containment device includes a number of spring devices to maintain contact between an electronic module and an enclosure. The spring device includes a spring portion to contact an electronic module disposed in the enclosure. A guide device of the spring device controls movement of the spring portion and an alignment mechanism maintains alignment of the spring portion.

18 Claims, 9 Drawing Sheets

(56) References Cited

U.S. PATENT DOCUMENTS

| | | | |
|---|---|---|---|
| 7,646,592 | B2 | 1/2010 | McCormick et al. |
| 8,816,219 | B2 | 8/2014 | Kim |
| 9,717,169 | B2 * | 7/2017 | Bodette ................ H05K 9/0062 |
| 2011/0188226 | A1 | 8/2011 | Kim |
| 2014/0340864 | A1 | 11/2014 | Wu et al. |

* cited by examiner

US 11,026,357 B2

CONTAINING ELECTRO-MAGNETIC INTERFERENCE (EMI) USING A NUMBER OF LOW-PROFILE SPRING DEVICES

BACKGROUND

Data centers are used to store large amounts of data. Data centers can be quite large, sometimes filling entire rooms. These data centers can include rows of enclosures that hold electronic modules. Examples of electronic modules include hard drive disks (HDD), networking switches, input/output (I/O) modules, and any number of other electronic modules. The electronic modules allow the data center to process and store the large amounts of data as well as perform other functions. During operation, the electronic modules emit electromagnetic waves which may cause interference with other electronic devices in the data center.

BRIEF DESCRIPTION OF THE DRAWINGS

The accompanying drawings illustrate various examples of the principles described herein and are a part of the specification. The examples do not limit the scope of the claims.

Throughout the drawings, identical reference numbers designate similar, but not necessarily identical, elements.

DETAILED DESCRIPTION

Figure 1:
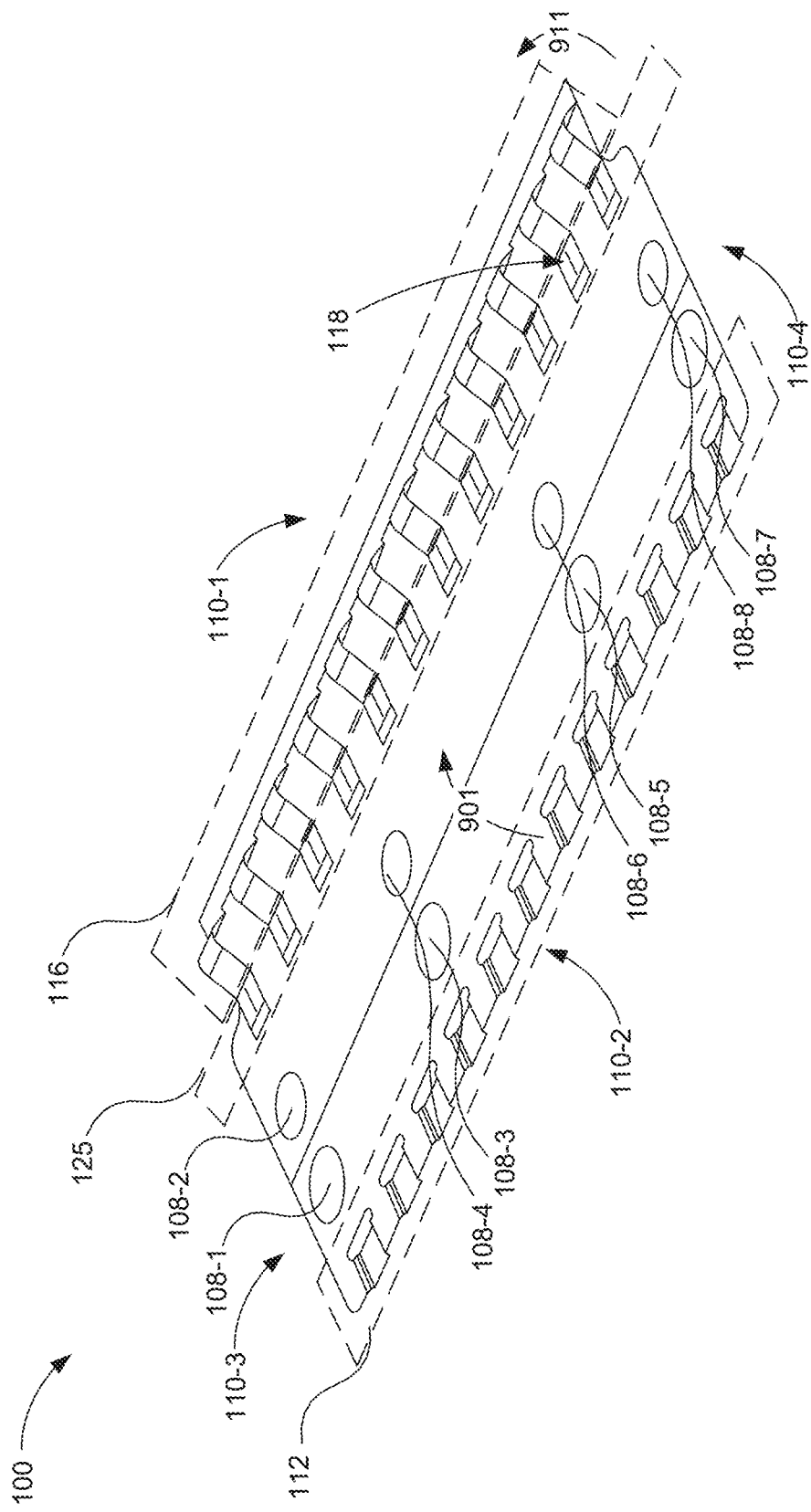
FIG. 1 is an isometric view of an electro-magnetic interference (EMI) containment device before completion of the manufacturing of the EMI containment device, according to one example of principles described herein.

Data centers are used in many organizations to store large amounts of information. These data centers include rows of enclosures to hold electronic modules, such as hard drive disks (HDD), networking switches, input/output (I/O) modules, and other electronic modules that allow the organization to store the information as well as perform other functions. As data processing and data storage demands have grown, the data centers with greater storage capacity or processing capabilities are desirable, and trying to do so in a reduced amount of space to improve efficiency and storage capability is preferred. However, trying to increase the number of electronic modules placed within an enclosure such as a chassis or a rack has become increasingly harder to realize. For example, an individual enclosure may be limited to an overall height, which thereby limits the amount of electronic modules that can be stored therein. The number of modules available to be in a particular enclosure is also limited when considering tolerances for spacing between adjacent electronic modules and physical variation among different electronic modules. The gaps created between these electronic modules are to be minimized and sealed to prevent adverse effects of electro-magnetic interference (EMI) created by an electronic module and transmitted to other electronic modules in the data center.

To contain the electro-magnetic waves from the electronic modules within the enclosure, a number of mechanisms are used. Such mechanisms include parent material dimples, fabric over foam, large profile original design clips, and snap on clips.

While these mechanisms are useful in containing the electro-magnetic waves, certain disadvantages lead to a less efficient storage of electronic modules in an enclosure. For example, parent material dimples include a number of finger like springs and dimples to maintain sheet metal contact with the enclosure and an electronic module. The parent material dimples need space to allow them to deflect when placing the electronic modules in the enclosure. Moreover, the parent material dimples cannot have a tight pitch from dimple to dimple. For example, if the parent material dimples have two dimples, the two dimples are to be spaced far enough apart that the two dimples function as intended. This causes an issue with the stack height for the electronic modules if the dimples need to be spaced far apart. Further, a fabric over foam is a piece of foam covered in conductive fabric that is placed on a removable module or on the enclosure to contain EMI. The fabric over foam blocks airflow needed to cool the electronic modules in the enclosure and can also be expensive. The large profile original design clips disposed on the electronic module increase the manufacturing cost due to the complex manufacturing process for the large profile original design clips. With hundreds of electronic modules in the data center, this can add a significant amount of cost to the installation and maintenance of a data center. Snap on clips are spring like pieces of metal that snap onto the enclosure and contact an electronic module to contain EMI. The snap on clips can become damaged when the electronic modules are repeatedly inserted and removed from the enclosure. As a result, the snap on clips must either be replaced, or more likely the EMI containment is degraded. The snap on clips also pose a risk of becoming lost inside the enclosure and risking damage to the electronic modules and other electronic components within the enclosure. With hundreds of electronic modules in the data center, this can lead to an increase in cost for the data center and unnecessary risk.

Accordingly, the present specification describes an EMI containment device. The EMI containment device includes spring portions that are low profile and formed out of a single piece of material. As such they don't take up much space in the enclosure.

More specifically, the present specification describes an EMI containment device. The EMI containment device includes a number of spring devices to reliably contain EMI in an enclosure. A spring device includes a spring portion to maintain contact with an electronic module disposed in the enclosure. The spring device includes a guide device coupled to the spring portion to control movement of the spring portion. The spring device includes an alignment mechanism to maintain alignment of the spring portion.

The present specification also describes a system for containment of EMI. Such a system includes an enclosure with a number of bays. A bay to house the electronic module. An EMI containment device coupled to the enclosure for contacting the electronic module in the bay of the enclosure. The EMI containment device includes a number of spring devices to maintain contact with the electronic module in the enclosure. A spring device includes a spring portion to compress the electronic module against the enclosure to contain EMI in the enclosure. The spring device includes a flat portion coupled to the spring portion, the flat portion defining a slot therein that engages with a hook to prevent over compression of the spring portion. The spring device includes a cover to overlay the flat portion to maintain alignment of the spring device.

The present specification also describes a method for manufacturing an EMI containment device. Such a method includes forming a spring portion and a guide device on a first side of a piece of metal, forming an alignment mechanism on a second side of the piece of metal, and folding the piece of metal such that the alignment mechanism covers a flat portion of the guide device to maintain alignment of the spring portion.

An EMI containment device as described herein can sustain a large number of insertion and removal cycles. For example, an individual electronic module can be inserted and removed from a bay, or different electronic modules can be inserted and removed from a bay hundreds of times without the EMI containment device failing. Further, the EMI containment device accommodates the thermal tolerances for a data center. For example, during use electronic modules get hot from use. Accordingly, thermal gaps between adjacent electronic modules and/or the electronic modules and the enclosure allows for cooling fluid to pass around the electronic modules. The EMI containment device facilitates these thermal gaps. In an example, a thermal gap is created between the body of the EMI containment device and the top of the electronic module only between each of the spring devices. The EMI containment device is a low-profile design that meets containment pitches for the latest electronic modules. The containment pitches include the thermal gap between the EMI containment device mounted on a top portion of the enclosure and the electronic module. The EMI containment device is formed from a single piece of material. Forming the EMI containment device from a single piece of material allows for a robust design that is easy to manufacture and that is cost effective to produce. Lastly, the EMI containment device can be made of stainless steel to meet the EMI needs of the data center. For example, it is undesirable for EMI to be transferred from enclosure to enclosure. The EMI containment device aids the data center in containing the EMI within the enclosure.

Further, as used in the present specification and in the appended claims, the term "a number of" or similar language is meant to be understood broadly as any positive number comprising 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples.

Referring now to the figures, FIG. 1 is an isometric view of an EMI containment device (100) before completion of the manufacturing of the EMI containment device, according to one example of principles described herein. Specifically, FIG. 1 is an isometric view of the EMI containment device before the EMI containment device is folded over on itself.

As mentioned above, data centers include rows of enclosures to physically hold electronic modules, such as HDD modules, networking switches, I/O modules, and other electronic modules. The EMI containment device (100) maintains the electronic modules in the enclosure such that the electronic modules are adequately contacted.

The EMI containment device (100) includes a first side (110-1), a second side (110-2), a third side (110-3) and a forth side (110-4). The length of the first side (110-1) is equal to the length of the second side (110-2), which length may vary depending on the specific size of the enclosure and/or the electronic module. For example, if the enclosure houses a HDD, the length of the first side (110-1) and the length of the second side (110-2) may be 105 millimeters (mm).

Similarly, the length of the third side (110-3) may be equal to the length of the forth side (110-4), which length may vary depending on the size of the enclosure and/or the electronic module. For example, if the enclosure houses the HDD described above, the length of the third side (110-3) and the length of the forth side (110-4) may be 25.9 mm. However, the length of the first side (110-1) and the second side (110-2) is longer than the length of the third side (110-3) and the forth side (110-4).

While specific reference is made to specific sizes, the EMI containment device (100) can be scaled up or down in size. For example, the length of the first side (110-1) and the length of the second side (110-2) may be longer or shorter than 105 mm. The length of the third side (110-3) and the length of the forth side (110-4) may be longer or shorter than 25.9 mm. This allows the EMI containment device (100) to retain different types of electronic modules that vary in size and contain EMI of the electronic modules.

The EMI containment device (100) may be made out of any material that can withstand the constant handing and wear and tear associated with inserting and removing an electronic module from an enclosure. For example, the electronic modules can be inserted and removed from the enclosure hundreds of times. As a result, the EMI containment device (100) should be able to withstand this wear and tear. Accordingly, in some examples, the EMI containment device (100) can be made of a metal such as stainless steel. Specifically, the EMI containment device (100) is made from a minimum of ½ hardened stainless steel, but preferably ¾ hardened stainless steel. In some examples, the stainless steel is hardened by via heat treatments of quenching followed by tempering. These heat treatments allow the stainless steel to become hardened such that the stainless steel is less like to yield when subjected to forces. In an example, ¾ hardened stainless steel undergoes more heat treatments than ½ hardened stainless steel. As a result, ¾ hardened stainless steel has a higher yield strength than ½ hardened stainless steel. Forming the EMI containment device (100) out of ¾ stainless steel allows the EMI containment device (100) to withstand several years of use without failing.

In other examples, the EMI containment device (100) is made from other metals such as beryllium copper. Although beryllium copper may not have as high of a yield strength as ¾ hardened stainless steel, beryllium copper may be a suitable material because if the EMI containment device (100) is made from beryllium copper, the EMI containment device (100) can withstand several years of use without failing. While specific reference is made to stainless steel and beryllium copper as materials for the EMI containment device (100), the EMI containment device (100) may be made from any other suitable materials that can withstand the wear and tear of an electronic module being inserted and removed from the enclosure in the data center.

Still further, forming the EMI containment device (100) out of a suitable material satisfies EMI tolerances of the data center. For example, in a data center EMI can cause undesired interference with the electronic modules. Often, EMI is to be contained within an enclosure in the data center to prevent these undesired interferences. Again, stainless steel or beryllium copper are suitable materials that meet this EMI need.

The EMI containment device (100) may be manufactured from a single piece of material such as stainless steel. Specifically, the EMI containment device (100) is manufactured from a single piece of stainless steel that is 0.1 mm thick. As will be described below, once the manufacturing process of the EMI containment device (100) is complete, the majority of EMI containment device (100) is 0.2 mm thick. As a result, the EMI containment device (100) is a low profile design.

To contain the EMI of the electronic modules in the enclosure, the EMI containment device (100) includes a spring device (330). The spring device (330) is a portion of the EMI containment device (100) that reliably contacts the electronic module to the enclosure.

The spring device (330) includes a spring portion (116) to maintain contact with the electronic module disposed in the enclosure. As will be described below, the spring portion (116) is a curved piece of the EMI containment devices (100) that compresses when contact is made with an electronic module. To form the spring portion (116), the spring portion (116) as well as the guiding device (125) is stamped out of the stainless steel and folded over as indicated by arrow 911. In one example, the spring portion (116) is located along the first side (110-1) of the EMI containment device (100).

The EMI containment device (100) also includes a guide device (125). The guide device (125) controls movement of the spring portion (116). For example, as the spring portion (116) deflects, the guide device (125) ensures that the spring portion (116) travels along a certain path of travel. The guide device (125) also ensures that the spring portion (116) does not permanently deform by being over-compressed. In other words, the guide device (125) stops the spring portion (116) from over compressing or under compressing.

The EMI containment device (100) also includes an alignment device (112). The alignment device (112) is located along the length of the second side (110-2). The EMI containment device (100) is folded over, as indicated by arrow 901, such that the alignment mechanism (112) covers a flat portion (118) to maintain alignment of the spring portion (116) and/or the guide device (125). Such an EMI containment device (100) can sustain a large number of insertion and removal cycles. For example, an individual electronic module can be inserted and removed from a bay, or different electronic modules can be inserted and removed from a bay hundreds of times without the EMI containment device (100) failing.

In some examples, the EMI containment device (100) includes a number of rivet holes (108-1, 108-2, 108-3, 108-4, 108-5, 108-6, 108-7, 108-8) The rivet holes (108) receive a number of rivets to secure the EMI containment device (100) to the enclosure. In other examples, the EMI containment device (100) is secured to the enclosure using other mechanisms. For example, the EMI containment device (100) could we welded to the enclosure or an adhesive could be used to glue the EMI containment device (100) to the enclosure.

Figure 2:
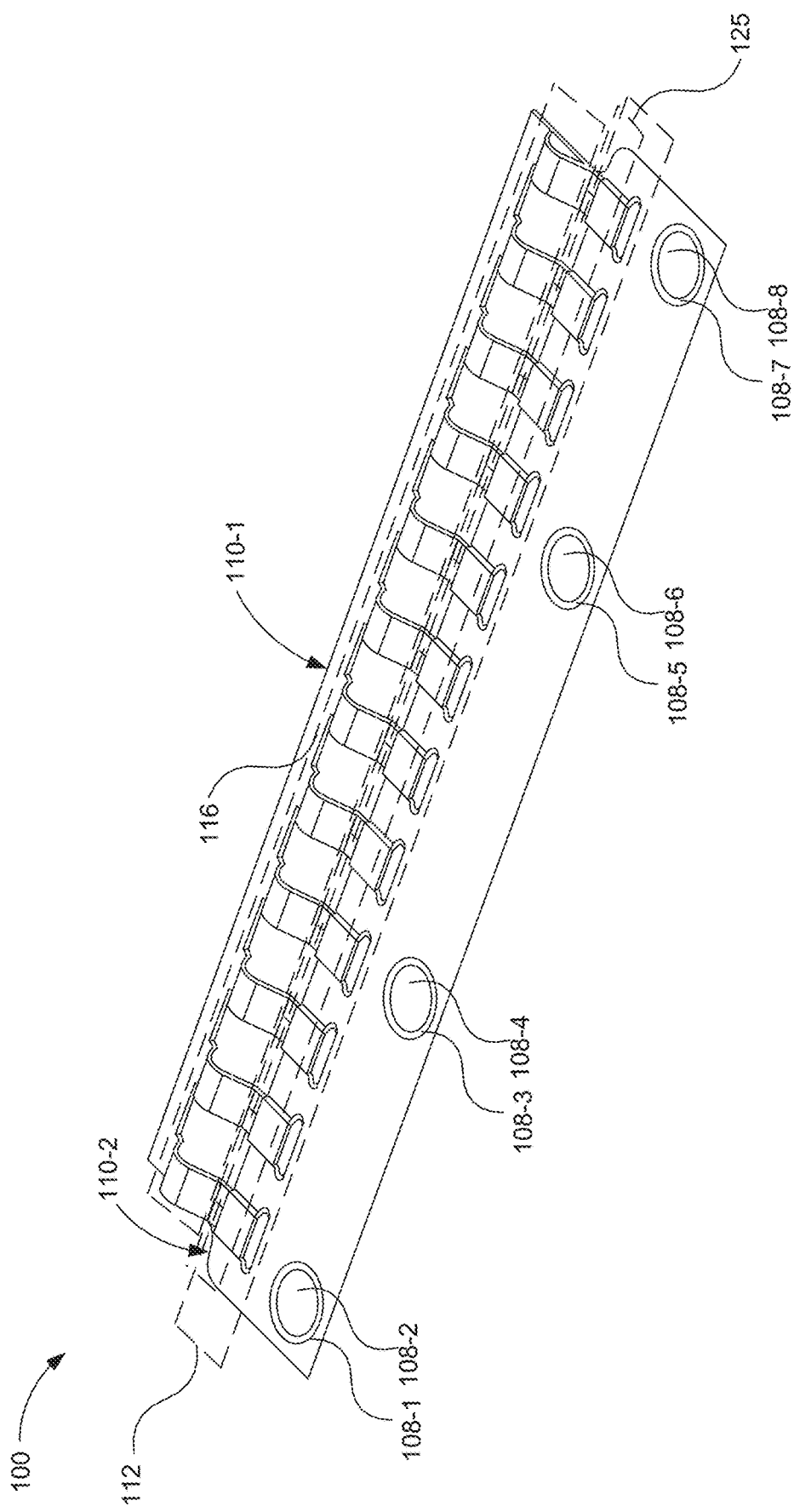
FIG. 2 is an isometric view of the EMI containment device, according to one example of principles described herein.

FIG. 2 is an isometric view of the EMI containment device (100), according to one example of principles described herein. Specifically, FIG. 2 is an isometric view of the EMI containment device (100) that is prepared to be secured into an enclosure.

As illustrated in FIG. 2, the EMI containment device (100) has been folded over as indicated by arrow 901 in FIG. 1. By folding the EMI containment device (100) over on itself, the alignment mechanism (112) covers flat portions of the guide device (125) to maintain alignment of the spring portion (106).

Further, the rivet holes (108) are positioned such that they are aligned when the EMI containment device (100) has been folded over. For example, as illustrated in FIG. 2, the first rivet hole (108-1) is aligned with the second rivet hole (108-2), the third rivet hole (108-3) is aligned with the fourth rivet hole (108-4), the fifth rivet hole (108-5) is aligned with the sixth rivet hole (108-6), and the seventh rivet hole (108-7) is aligned with the eighth rivet hole (108-8).

While this example has been described with reference to the EMI containment device (100) being manufactured from a single piece of material and then folded over as illustrated in FIG. 2, the EMI containment device (100) may be manufactured as two pieces of material. These two pieces of material can be glued, welded, riveted together, or otherwise joined such that the EMI containment device (100) is assembled as illustrated in FIG. 2.

Figure 3A:
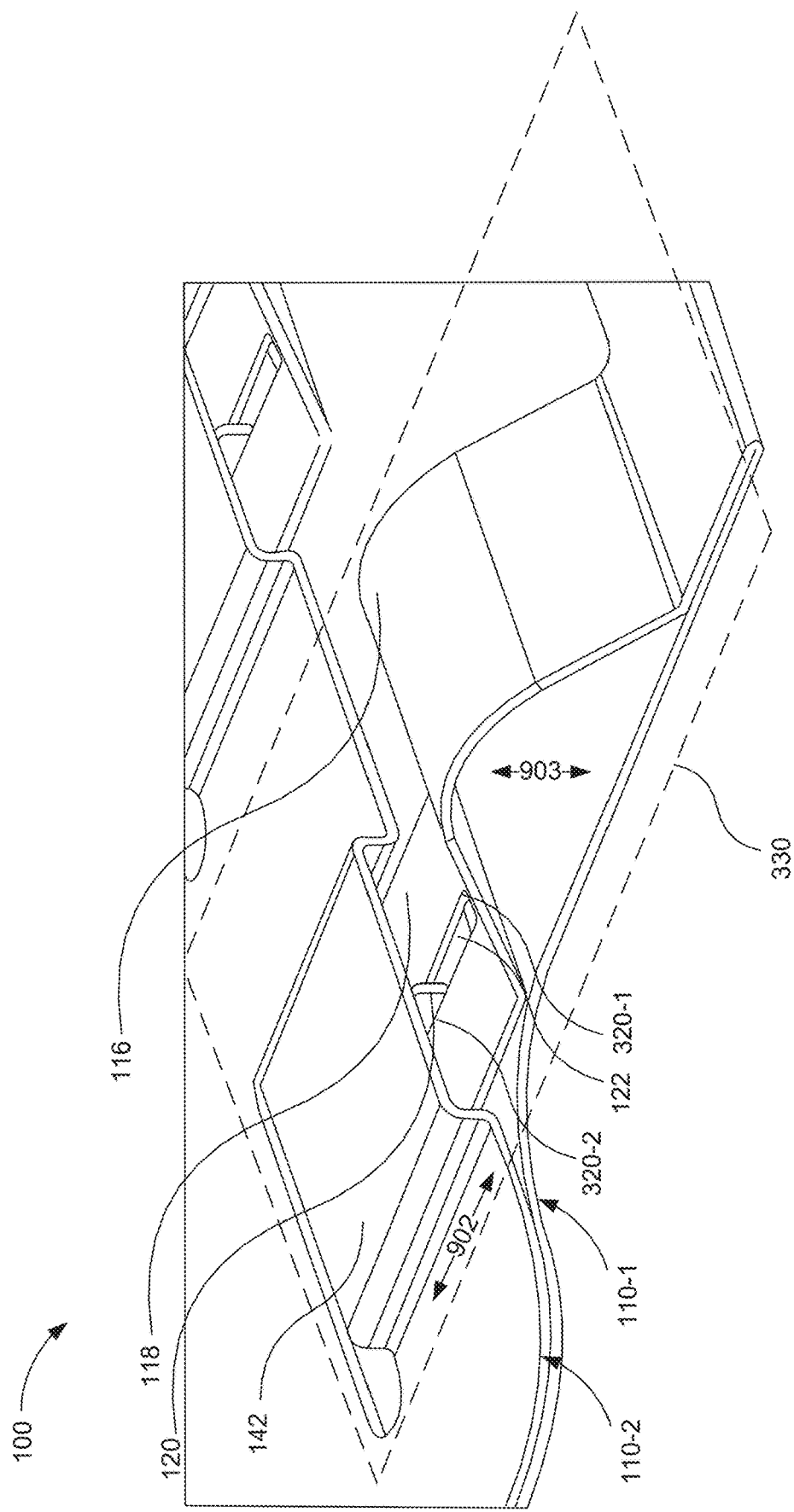
FIGS. 3A-3B are isometric views of an individual spring device of the EMI containment device, according to one example of principles described herein.
Figure 3B:
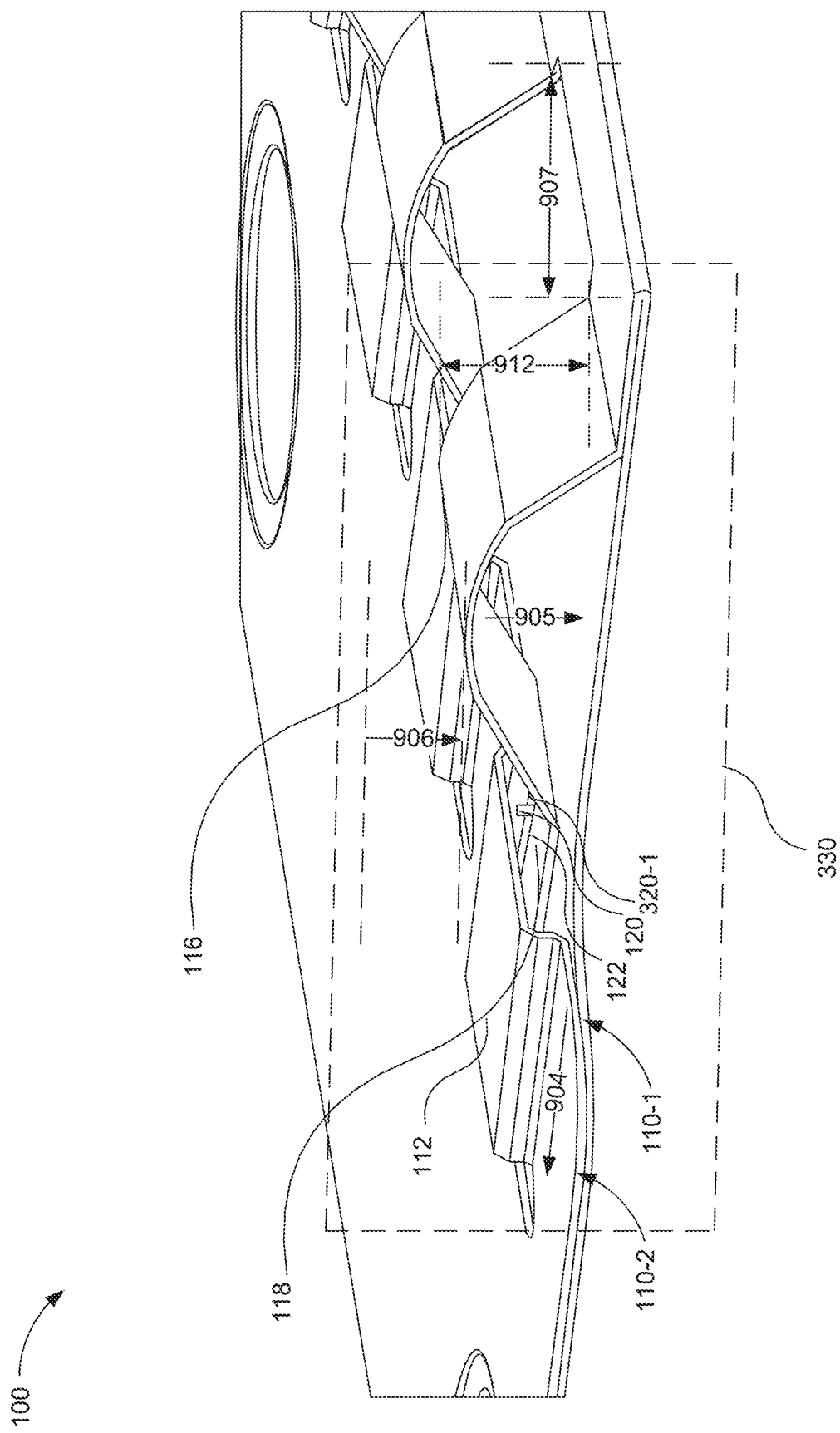

FIGS. 3A-3B are isometric views of an individual spring device (330) of the EMI containment device (FIG. 1, 100), according to one example of principles described herein. Specially, FIG. 3A is an isometric view of an uncompressed spring device (330) of the EMI containment device (FIG. 1, 100). When the spring device (330) is uncompressed, the spring portion (116) does not make contact with the electronic module.

In one example, the spring portion (116) is a curved piece of metal that generates a spring force when the spring portion (116) deflects when coming into contact with an electronic module. The spring portion deflects along an axis identified by the arrow 903. More specifically, as the spring portion (116) makes contact with the electronic module, the spring portion (116) deflects away from the electronic module (downward as depicted in FIG. 3A and towards a base of the EMI containment device (100). This deflection of the spring portion (116) generates a spring force against the electronic module that is inserted into the bay of the enclosure as illustrated in FIG. 3B. With the spring portion (116) making contact with the electronic module, the spring device (330) can reliably contain EMI in the enclosure. However, when the spring portion (116) isn't making contact with the electronic module, the spring portion (116) isn't compressed as illustrated in FIG. 3A.

As mentioned above, the EMI containment device (100) includes a guiding device (FIG. 1, 125) to guide a motion of the spring portion (116) during deflection. The guiding device (FIG. 1, 125) may include a flat portion (118). The flat portion (118) is coupled to the spring portion (116) and has a slot (122) defined therein. As the spring portion (116) deflects down along the axis identified by the arrow 903, the flat portion (118) moves along a direction indicated by arrow 902. For example, when the spring portion (116) deflects due to contact with the electronic module, the flat portion (118) moves from a first position to a second position along an axis identified by 902. In this example, when the spring portion (116) is compressed, the flat portion (118) is in the second position, which second position is indicated in FIG. 3B. When the spring portion (116) is uncompressed, the flat portion (118) is in the first position as indicated in FIG. 3A.

A hook (120) of the EMI containment device (100) engages with the slot (122) to prevent over compression of the spring portion (116). For example, the slot (122) has a first end (320-1) and a second end (320-2). In an example, the flat portion (118) is free to move along the arrow 902 as the spring portion (116) compresses and uncompresses until the hook (120) contacts the first end (320-1) or the second end (320-2). For example, when the spring portion (116) is fully compressed when maintaining contact with the electronic module, the hook (120) makes contact with the first end (320-1) of the slot as depicted in FIG. 3B, such a position is the second position described above. When in the second position, i.e., the hook (120) being in contact with the first end (320-1), the spring portion (116) is prevented from being further compressed. Accordingly, the length of the slot (122) may be designed so as to prevent over compression of the spring portion (116). When the spring portion (116) is not compressed, the hook (120) makes contact with the second end (320-2) of the slot (122) as depicted in FIG. 3A. Such a position as the first position described above. When in the first position, i.e, the hook (120) being in contact with the second end (320-2), the spring portion (116) is prevented from being under compressed.

The alignment mechanism (FIG. 1, 112) may include a cover (142). The cover (142) covers the flat portion (118) to maintain alignment of the flat portion (118) and the spring portion (116). As described above, the cover (142) is formed on the second side, and is made to cover the flat portion (118) when the EMI containment device (100) is folded over prior to use. The cover (142) prevents any undesired lateral or vertical movements of the spring portion (116) as the flat portion (1008) motion is restricted in those directions.

FIG. 3B is an isometric view of a compressed spring device (330) of the EMI containment device (FIG. 1, 100). As the electronic module comes into contact with the spring portion (116), the spring portion (116) deflects as indicated by arrow 905. This motion is transferred as the flat portion (118) moves as indicated by arrow 904. As described the compression of the spring portion (116) stores energy as the deflected piece of metal is removed from its stable position. The tendency of this spring portion (116) to return to its stable position exerts a force against the electronic module. This allows the spring portion (116) to maintain contact with the electronic module.

Again, to keep the spring portion (116) from over compressing, the hook (120) makes contact with the first end (320-1) of the slot (122). In an example, the spring portion (116) compresses up to 0.75 mm as indicated by arrow 906 before the hook (120) makes contact with the first end (320-1) of the slot (122).

Since the hook (120) makes contact with the first end (320-1) of the slot (122) when the spring portion (116) is compressed, the spring portion (116) does not flatten out to the point where the top of the spring portion (116) contacts the body of the EMI containment device (100). This provides a thermal gap as indicated by arrow 912 and 907. In an example, arrow 912 represents a first gap between the body of the EMI containment device (100) and the top of the spring portion (116). Arrow 907 represents a second gap between each of the spring devices (330). Both the second gap and the first gap create the thermal gap. As a result, a thermal gap is created between the body of the EMI containment device (100) and the top of the electronic module only between each of the spring devices (330). The thermal gap allows air to flow into or out of the enclosure (400) while the spring portion (116) maintains contact with the electronic module such that the electronic module with the enclosure may be cooled. The thermal gap can be adjusted to suit different enclosure and electronic module tolerances.

While this example has been described with reference to the spring portion (116) compressing up to 0.75 mm, the spring portion (116) may compress less than 0.75 mm or more than 0.75 mm depending upon the configuration of the enclosure and the electronic modules.

Figure 4:
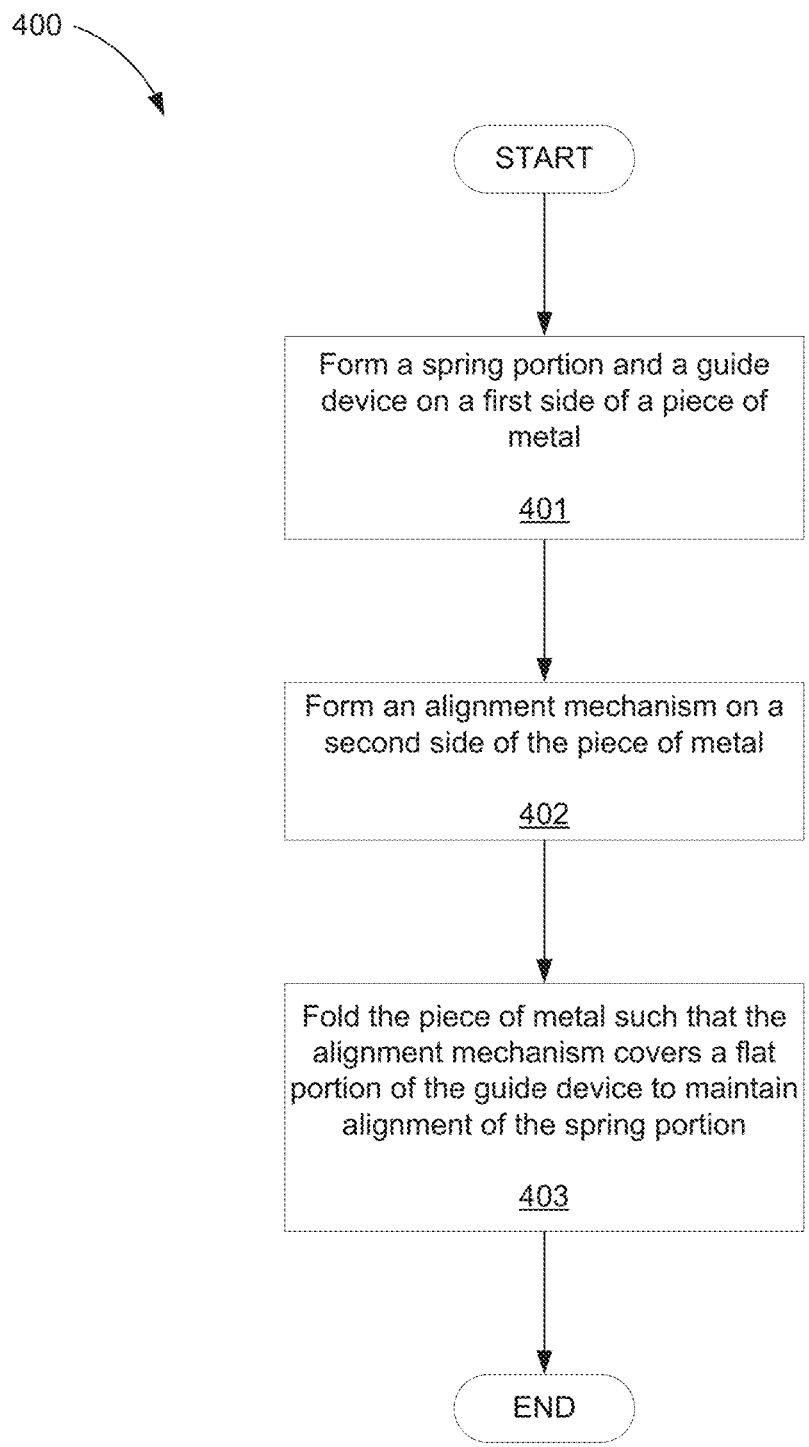
FIG. 4 is a flowchart a method for manufacturing the EMI containment device, according to one example of principles described herein.

FIG. 4 is a flowchart a method (400) for manufacturing an EMI containment device (100, FIG. 1), according to one example of principles described herein.

In an example, the method (400) includes forming (401) a spring portion (116) and a guide device (125) on a first side (110-1) of a piece of metal. In an example, the spring portion (116), the guide device (125) may be formed via a number of methods. The methods include stamping or cutting the spring portion (116) and the guide device (125) from the single piece of metal. In an example, the spring portion (116) and the guide device (125) is formed from the piece of metal first and then folded over as indicated by arrow 911 of FIG. 1.

The method (400) includes forming (402) an alignment mechanism (112) on a second side (110-2) of the piece of metal. In some examples the alignment mechanism (112) is formed by deforming the piece of metal such that the alignment mechanism (112) of FIG. 1 is formed.

The method (400) includes folding (403) the piece of metal such that the alignment mechanism (112) covers a flat portion (118) of the guide device (125) to maintain alignment of the spring portion (116). In an example, the piece of metal is folded as illustrated by arrow 901 of FIG. 1, such that the EMI containment device (100) of FIG. 2 is formed as described above. Such a method (400) allows the EMI containment device (100) to be manufactured from a single piece of material.

Figure 5:
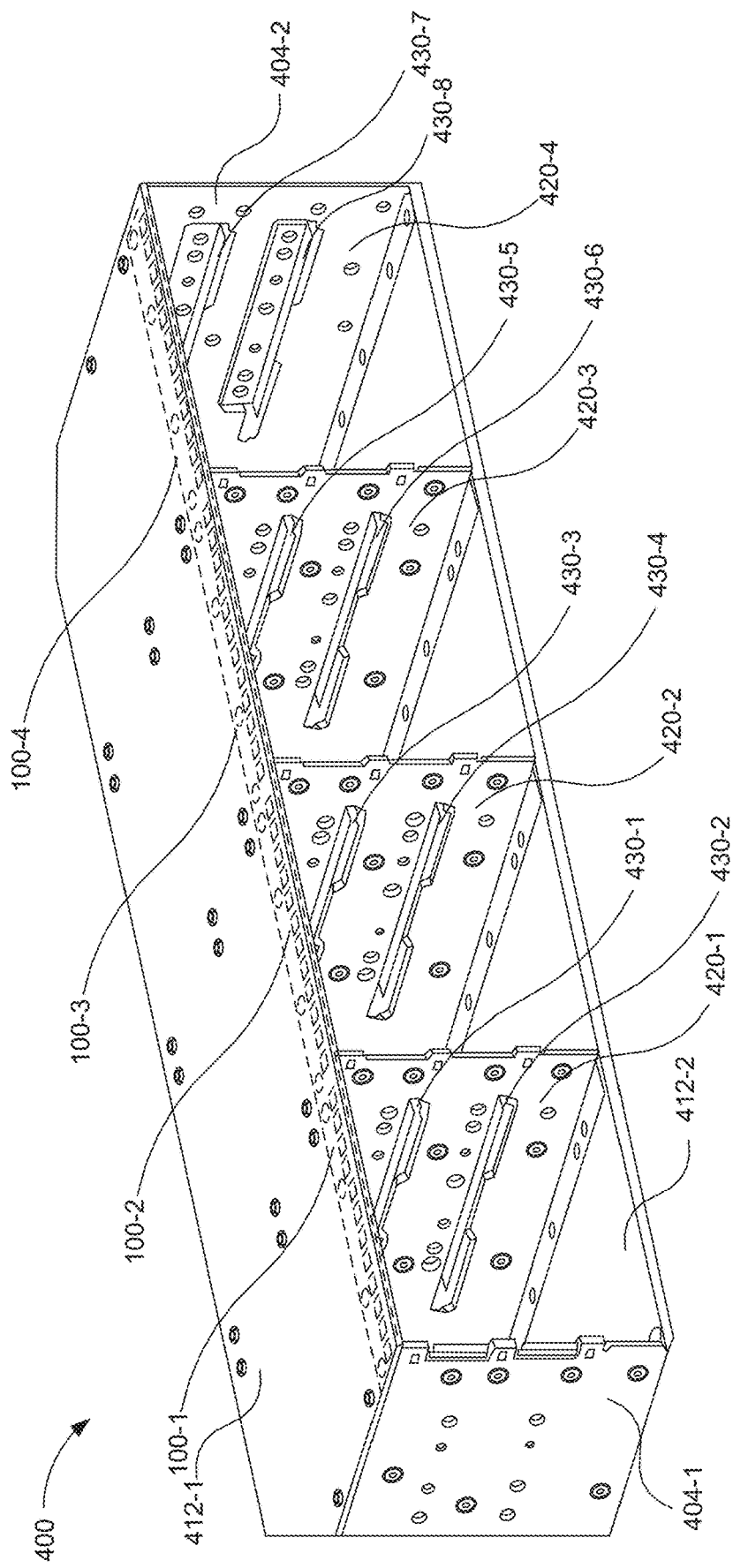
FIG. 5 is an isometric view of multiple EMI containment devices mounted in an enclosure, according to one example of principles described herein.

FIG. 5 is an isometric view of multiple EMI containment devices mounted on an enclosure, according to one example of principles described herein.

The enclosure (400) is defined by a top portion (412-1), a bottom portion (412-2), a left side (404-1), and a right side (404-2). The enclosure (400) includes a number of bays to receive electronic modules. In an example, the enclosure (400) includes four units, the units defined by the number of vertical walls (420) and the sides (440). The enclosure (400) includes a number of bays. The bays may be defined at least in part, by a number of vertical walls (420-1, 420-2, 420-3) and a number of horizontal dividers (430). In this example, the enclosure (400) includes twelve bays, i.e. thee bays per unit.

While this example has been described with reference to the enclosure (400) including four units with three bays per unit, the enclosure may be any number of units and bays suitable for the designed purpose of the enclosure. For example, the enclosure may be two units with two bays per unit. Moreover, while FIG. 4 depicts the enclosure (400) in a particular configuration of bays, an enclosure (400) may have any number of configurations with any number of column and/.or bays.

In an example, multiple EMI containment devices (100) are mounted on a top portion (412-1) of the enclosure (400) as illustrated in FIG. 4. For example, the enclosure (400)

includes four EMI containment devices (100) with one EMI containment device (100) per unit. More specifically, the EMI containment devices (100) are mounted such that the spring devices (330) face an interior portion of the enclosure (400) where the electronic modules will be inserted. As a result, when an electronic module is inserted into one of the top bays, the spring portion (FIG. 1, 116) of the EMI containment device (FIG. 1, 100) is compressed to maintain reliable contact with the electronic module in the enclosure (400). While FIG. 4 depicts the EMI containment device (100) as being mounted to a top portion (412-1) of the enclosure (400) to accommodate existing features of electronic modules, the EMI containment device (100) could be mounted in other locations in the enclosure (400).

Figure 6:
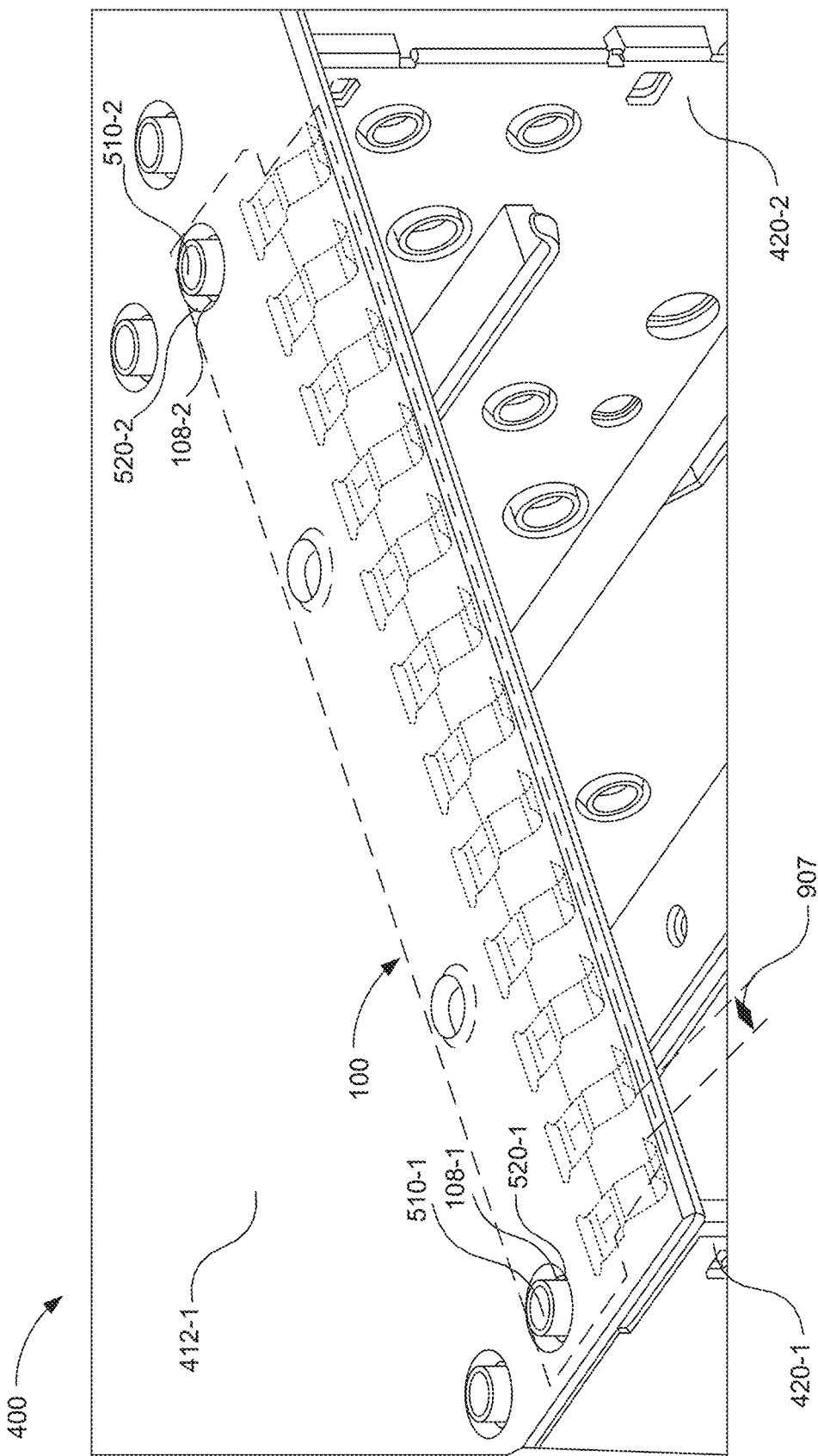
FIG. 6 is an isometric view of an individual EMI containment device mounted in the enclosure, according to one example of principles described herein.

FIG. 6 is an isometric view of an individual EMI containment device (100) mounted on the enclosure (400), according to one example of principles described herein.

As described above in FIG. 5, in some examples, the EMI containment device (100) is mounted on the top portion (412-1) of the enclosure (400). In this example, the EMI containment device (100) is secured to the enclosure (400) via rivets (510-1, 510-2). The rivets (510) are inserted into the rivet holes (108) formed in the EMI containment device (100) and corresponding rivet holes (520) formed in the enclosure (400). As described above the EMI containment device (100) is secured to the enclosure via other methods such as welding and using adhesives.

As illustrated, the number of spring devices (330) of the EMI containment device (100) is evenly spaced along a length of the EMI containment device (100). This provides a second gap as indicated by arrow 907 between each of the spring devices (330). As described above, this second gap along with a first gap creates a thermal gap. The thermal gap allows air to flow into or out of the enclosure (400) such that the electronic modules with the enclosure may be cooled. The spacing of the spring devices (330) can be adjusted wider or narrower to suit different enclosure, electronic module requirements, and thermal needs. As such, the EMI containment device (100) may include more or less spring devices (330) than illustrated in FIG. 5 depending on the size of the second gap needed to create the thermal gap.

Figure 7:
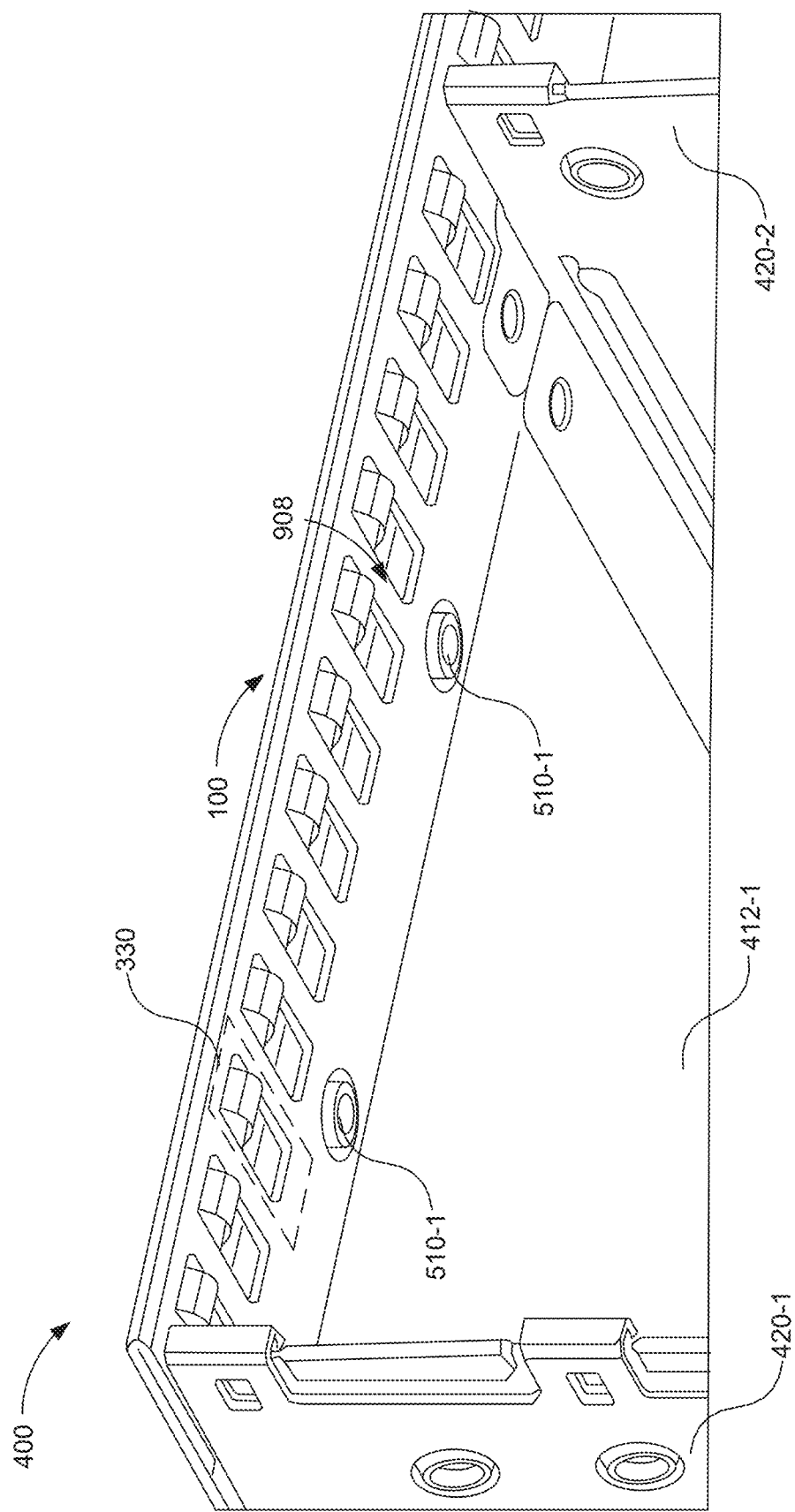
FIG. 7 is an isometric view of the individual EMI containment device mounted in the enclosure, according to one example of principles described herein.

FIG. 7 is an isometric view of the individual EMI containment device (100) mounted on the enclosure (400), according to one example of principles described herein. Specifically, FIG. 7 depicts the underside of the top portion (412-1) of the enclosure (400). As described above, the EMI containment device (100) can be installed via aligning rivet holes (108) in the EMI containment device (100) and rivet holes (520) in the enclosure (400) and joining the two via rivets (510). Again, while specific reference is made to rivets and rivet holes being used to join the enclosure and the electronic module, any type of mechanism may be used to adjoin the enclosure and the electronic module.

To assemble the EMI containment device (100) to the enclosure (400), the EMI containment device (100) is folded around an edge of the enclosure (400) for example as indicated by arrow 908.

Figure 8:
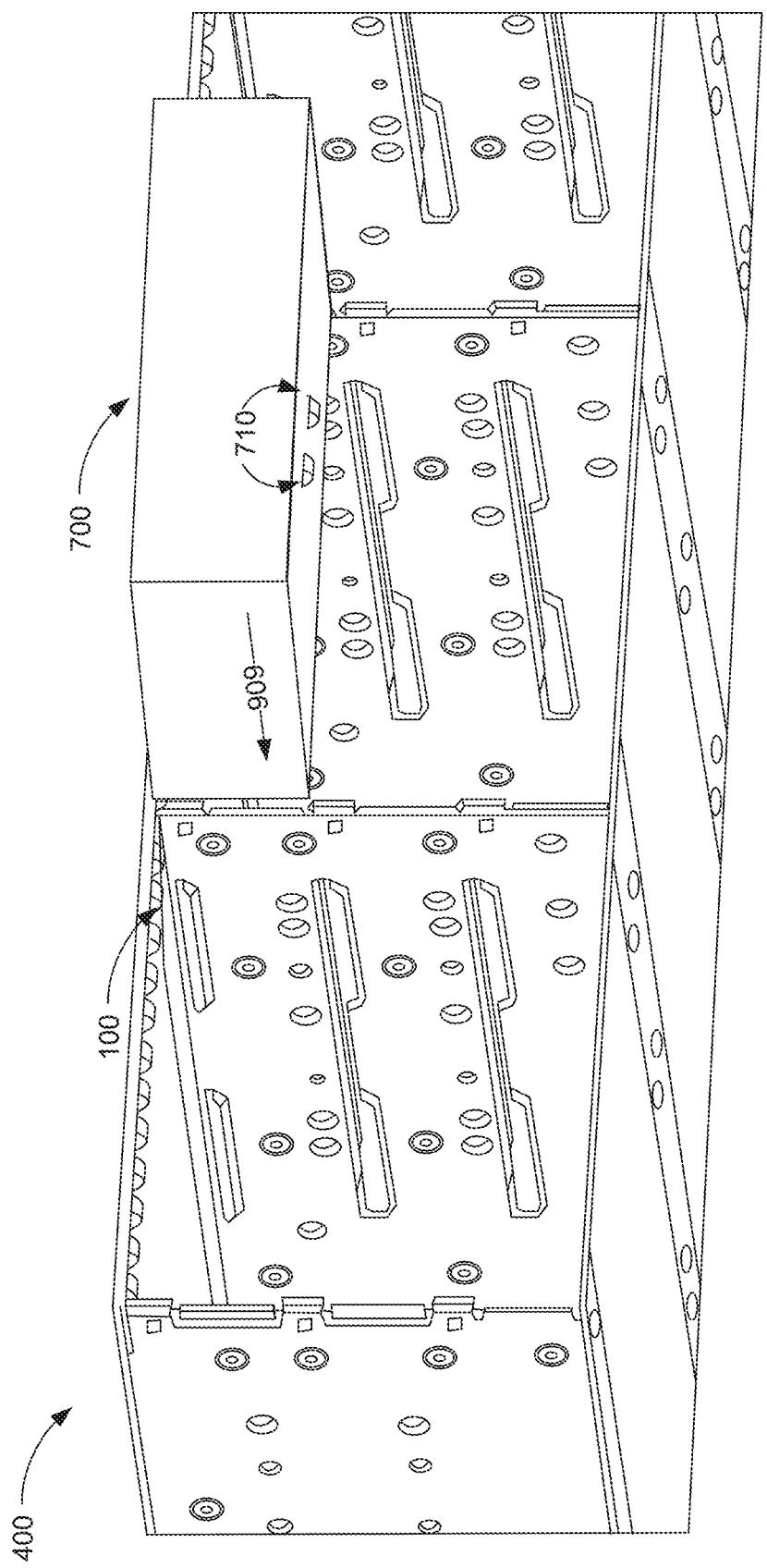
FIG. 8 is an isometric view of an electronic module being removable secured in the enclosure, according to one example of principles described herein.

FIG. 8 is an isometric view of an electronic module (700) being removed from the enclosure (400), according to one example of principles described herein.

As the electronic module (700) is being inserted into the enclosure (400), as indicated by arrow 909, the electronic module (700) makes contact with the spring portion (FIG. 1, 116) of the EMI containment device (FIG. 1, 100) thereby compressing the spring portion (FIG. 1, 116). When the spring portion (FIG. 1, 116) is compressed when maintaining contact with the electronic module (700), the airflow needed to cool the electronic module (700) is allowed through the thermal gaps created between each of the spring devices (330), In some examples, an electronic module (700) includes a number of clips (710) to provide a thermal gap between another electronic module placed below the electronic module (700) on the enclosure (400). The clips (710) are located on the bottom of the electronic module (700). Accordingly, when another electronic module is placed below the electronic module (700), the clips (710) make contact with the top of the other electronic module and compress. Similar to the EMI containment devices (100), compression of the clips (710) forms an EMI containment enclosure. Also similar to the EMI containment devices (100), these clips (710) provide a thermal gap between the spacing of the individual spring devices (330) such that air can pass by the electronic modules to cool them.

The preceding description has been presented to illustrate and describe examples of the principles described. This description is not intended to be exhaustive or to limit these principles to any precise form disclosed. Many modifications and variations are possible in light of the above teaching.

What is claimed is:

1. An electro-magnetic interference (EMI) containment device comprising:
    a number of spring devices to contain EMI in an enclosure, wherein each spring device comprises:
        a spring portion to maintain contact with an electronic module disposed in the enclosure;
        a guide device coupled to the spring portion to control movement of the spring portion; and
        an alignment mechanism to maintain alignment of the spring portion.

2. The EMI containment device of claim 1, wherein the EMI containment device is made of stainless steel.

3. The EMI containment device of claim 2, where in the stainless steel is at least ¾ hardened.

4. The EMI containment device of claim 1, wherein the EMI containment device is manufactured from a single piece of material.

5. The EMI containment device of claim 1, wherein the EMI containment device is 0.2 millimeters (mm) thick.

6. The EMI containment device of claim 1, wherein the spring portion compress up to 0.75 millimeters (mm).

7. A system for containment of electro-magnetic interference (EMI) comprising:
    an enclosure with a number of bays, wherein a bay houses an electronic module; and
    an EMI containment device coupled to the enclosure for contacting the electronic module in the bay of the enclosure, the EMI containment device comprising:
    a number of spring devices to maintain contact with the electronic device in the enclosure, a spring device comprising:
    a spring portion to compress the electronic module against the enclosure to contain the EMI in the enclosure;
        a flat portion coupled to the spring portion, the flat portion defining a slot therein that engages with a hook to prevent over compression of the spring portion; and
    a cover to overlay the flat portion to maintain alignment of the spring device.

8. The system of claim 7, wherein the EMI containment device is mounted on a top portion of the enclosure.

9. The system of claim 7, wherein the EMI containment device provides a thermal gap between each of the spring devices and maintains contact between the enclosure and the electronic module.

10. The system of claim 7, wherein the spring portion and the flat portion are disposed on one side of a piece of material and the cover is disposed on another side such that upon folding the piece of material, the cover overlays the flat portion of the spring device.

11. The system of claim 7, wherein the number of spring devices are evenly spaced along a length of the EMI containment device.

12. The system of claim 7, wherein the number of spring devices are compressed when the electronic module is inserted into the bay of the enclosure.

13. The EMI containment device of claim 7, wherein the spring portion is a curved piece of metal that generates a spring force when the spring portion deflects when coming into contact with the electronic module.

14. A method for manufacturing an electro-magnetic interference (EMI) containment device, the method comprising:
    forming multiple spring portions and multiple respective guide devices on a first side of a piece of metal;
    forming multiple alignment mechanisms on a second side of the piece of metal, wherein each alignment mechanism of the multiple alignment mechanisms corresponds to a guide device of the multiple respective guide devices; and
    folding the piece of metal such that each alignment mechanism of the multiple alignment mechanisms covers a flat portion of the corresponding guide device to maintain alignment of the spring portion.

15. The method of claim 14, wherein a thermal gap is provided between each spring device of the EMI containment device while the spring portion maintains contact with an electronic module disposed within an enclosure.

16. The method of claim 14, wherein the spring portion, the guide device, and the alignment mechanism are formed out of the piece of metal.

17. A method of containing EMI in an enclosure, the method comprising:
    coupling an EMI containment device to the enclosure, wherein the EMI containment device comprises a number of spring devices;
    disposing an electronic module in the enclosure;
    maintaining contact of a spring portion of each spring device of the number of spring devices with the electronic module;
    coupling a guide device of each spring device of the number of spring devices to the spring portion to control movement of the spring portion; and
    maintaining alignment of the spring portion with an alignment mechanism of each spring device of the number of spring devices.

18. The method of claim 17, wherein the coupling of the EMI containment device to the enclosure comprises mounting the EMI containment device to a top portion of the enclosure.

* * * * *